United States Patent [19]

McKeon et al.

[11] Patent Number: 5,202,639
[45] Date of Patent: Apr. 13, 1993

[54] METHOD AND APPARATUS FOR TESTING ANALOGUE CIRCUITS

[75] Inventors: Alice McKeon, Wadhurst; Antony Wakeling, Fleet, both of United Kingdom

[73] Assignee: Schlumberger Technologies Limited, Farnborough, United Kingdom

[21] Appl. No.: 839,735

[22] Filed: Feb. 19, 1992

Related U.S. Application Data

[63] Continuation of Ser. No. 462,555, Jan. 9, 1990, abandoned.

[30] Foreign Application Priority Data

Jan. 9, 1989 [GB] United Kingdom ............... 8900386

[51] Int. Cl.⁵ .......................................... G01R 31/02
[52] U.S. Cl. ................................ 324/537; 324/158 R
[58] Field of Search ..................... 324/537, 522–524, 324/500, 158 R; 371/24, 25.1, 26

[56] References Cited

U.S. PATENT DOCUMENTS

| | | | |
|---|---|---|---|
| 3,633,016 | 1/1972 | Walker et al. | 371/24 |
| 4,002,974 | 1/1977 | Thomas | 371/24 |
| 4,176,780 | 12/1979 | Sacher et al. | 371/26 X |
| 4,342,958 | 8/1982 | Russell | 324/537 X |
| 4,701,695 | 10/1987 | Chan et al. | 324/537 X |

OTHER PUBLICATIONS

IEEE Transactions on Circuits and Systems, vol. Cas-31, No. 7, Jul. 1984, pp. 609-621, A. Salama et al.
1987 International Test Conference, Paper 24.2, CH2347-2/87/0000/ 0586$01.00 Dec. 1987 IEEE, pp. 586-594, P. Deves et al.
1989 International Test Conference, Paper 5.2, CH2742-5/0000/ 0118$01.00 Dec. 1989 IEEE, pp. 118-123, A. McKeon et al.

Primary Examiner—Jack B. Harvey
Attorney, Agent, or Firm—Robert F. O'Connell

[57] ABSTRACT

An analogue circuit or unit under test is tested utilizing automatic test equipment and an interface unit to apply stimuli to the circuit the stimuli including supply potentials. A computer analyses the circuit as a network of nodes and modules to deduce a set of ranges of values at selected nodes, the ranges being determined from the set of the stimuli and a resultant set of test measurements, taken from nodes of the circuit by the interface and automatic test equipment, taking into account tolerances in the stimuli, the measurements and the nominal parameters of components of the circuit. If there is inconsistency among the derived ranges the computer treats as potentially faulty any module which could remove the inconsistency if the constraints imposed by that module were suspended. The computer controls an iterative, hierarchical process involving repetition of the sequence of steps using different sets of stimuli and/or measurements and/or different analyses of the circuit into nodes and modules, in particular with analysis in terms of successively smaller modules. In this way, the location of faults can be progressively narrowed down and corresponding output information can be given in a device such as a VDU or printer.

17 Claims, 12 Drawing Sheets

METHOD AND APPARATUS FOR TESTING ANALOGUE CIRCUITS

This is a continuation of copending application Ser. No. 07/462,555 filed on Jan.9, 1990, now abandoned.

BACKGROUND OF THE INVENTION (1) Field of the Invention

This invention relates to a method and apparatus for detecting and locating faults in analogue systems from the response of those systems to applied stimuli. The method is novel in the way in which it represents parameters within the system and models the expected behaviour of the system and its component parts.

The equipment comprises a means of interfacing with the analogue system to be tested, or Unit Under Test (UUT). This interface is as a standard piece of Automatic Test Equipment and provides power and stimuli as inputs to the UUT, and a load for the outputs. It also provides a means for measuring the values of the inputs and outputs, and also for taking measurements of other points within the UUT (Probing). The equipment also comprises a means for making physical and electrical contact to the UUT for the purposes of the test.

The power supplied and the stimuli are so chosen that the UUT can operate in the conditions under which it is to be tested. The outputs are created from the input stimuli of the UUT transformed by its function. The stimuli are also so chosen that, should a fault be introduced into the UUT, the output will be different from the output in a working state. The values of the inputs and outputs are all measured by the equipment and provided to computing equipment for analysis.

(2) Description of the Prior Art

Both In Circuit Testing (ICT) and Functional Testing are used for analogue as well as digital circuits. However, the problems of detecting and locating faults in analogue circuits are different and in some ways greater than for digital circuits. See for example P. Deves, P. Dague, J. Marx, O. Raiman Dedale: An Expert System for Troubleshooting Analogue Circuits, 1987 International Test Conference Proceedings pp 586-594. ICT attempts to isolate components and test them individually. Its needs for access to the components' connections is leading to increasing difficulties as packing densities increase. ICT forces conditions on the components in an attempt to isolate them from their environment, and then measures their response. The test generation is relatively easy because the circuit is tested a component at a time. However, there is often concern about the stresses caused by back-driving components on the board, and the function of the complete circuit is not tested. Functional Testing is often preferred for these reasons.

Functional Testing of a circuit is done by making it exercise its designed functions as accurately as possible. Consequently functional test programms are much more difficult to write, and the location of faults becomes much more complex. In digital circuits, fault location algorithms exist and fall into two categories, Fault Dictionary and Deductive.

Fault Dictionaries contain the responses expected from faults which can be simulated. In the case of digital circuits, the "stuck at" fault models provide an approximation to faults in both the components and connections.

In analogue circuits there are many possible modes of failure and consequent effects and the effects of tolerances make the definition of expected measurements imprecise. This makes Fault Dictionaries inappropriate. Other techniques for fault location often rely upon a representation of cause and effect in directed graphs. Analogue circuits tend to comprise closed loop feedback paths and large numbers of components which, like resistors, have no particular input or output. This makes directed graphs inappropriate.

There is no single set of values which the measurements must take for an analogue circuit to be said to be working. Acceptable test results have ranges which are dependent upon the tolerances within the circuit as well as the accuracy of the measurements. Any successful automatic diagnosis technique must take this into account. Also, it is difficult to measure the current flowing between components, but this is often a vital piece of information to define the state of a circuit.

Because of these difficulties most diagnosis of faults in analogue circuits has to be done by skilled technicians. This invention makes it possible to detect and locate faults in analogue circuits using minimal probing and only voltage measurements (although this does not mean to say that current measurements may not be used if desired). The method developed uses only descriptions of correct behaviour so that, provided the description is appropriately constrained, any type of fault is detectable.

SUMMARY OF THE INVENTION

The object of the present invention is to overcome the problems discussed above.

The present invention provides a method of testing an analogue circuit comprising an analysis cycle wherein a set of stimuli, including supply potentials, is selected for application to first nodes of the circuit, a set of test measurements is taken from second nodes of the circuit, the circuit is analysed as a network of nodes and modules to derive from the stimuli, measurements and constraints imposed by the modules, taking into account tolerances in all of these, at least two differently derived ranges of values of a variable at at least one of the complete set of nodes, and a fault is detected if differently derived ranges are incompatible.

In practice the analysis will be conducted repeatedly in respect of a plurality of nodes. If no inconsistencies are found the circuit may be passed as free from fault. Moreover in repeated analyses further constraints may be introduced by requiring a node at which derived ranges of a variable overlap have a value of the variable lying within a new range which is the intersection of the overlapping ranges. This further constraint is propagated in the ensuing analyses into the derivation of ranges at other nodes.

It will be appreciated that the invention effectively treats the stimuli and measurements as one set of known values and determines whether, given the module constraints, the circuit is internally self-consistent with this set of values. This is in contrast with known methods in which theoretical measurement values are derived from the stimuli and compared with actual measurement values. This distinction assumes particular significance when it comes to locating faults.

Once an inconsistency is found it is known that a fault exists. The problem is then to locate the fault. In the prior art it has been necessary to provide fault models which are used to derive alternative theoretical measurement values for comparison with the actual values. Even when the fault models are well chosen this can be a very inefficient way of locating faults.

The present invention does not require fault models. Likely fault locations are determined much more simply by removing constraints on modules. A module must always comply with the constraint that all the currents into the module sum to zero. Apart from this modules can be treated as "black boxes" which impose no relationships between node voltages and currents. If, to take a simple case, there is one module which, on any analysis removes inconsistencies when it is treated as a black box, there is a high probability that that module is faulty. It is a suspect module. In general there may be more than one suspect module (and indeed sometimes more than one faulty module). Once there is one or more suspect module it will often be necessary to confirm the diagnosis, eliminate suspects and/or locate the fault more precisely. This can be effected by repeated analysis cycles using different stimuli and/or measurements and/or circuit analyses so as to obtain additional information. In particular the analysis cycles may be carried out in a heirarchical manner so as to focus attention down to more specific circuit areas and analysis can be effected in terms of smaller modules to aid precise fault location.

It is preferred (but not essential) to restrict measurements to voltage measurements because of the difficulty of making current measurements. However the variables used for purposes of analysis need not be thus restricted.

The techniques used to detect and locate faults will now be described in more detail, followed by two examples to further explain the method.

BRIEF DESCRIPTION OF THE DRAWINGS

The detailed description is given with reference to the accompanying drawings, in which.

DESCRIPTION OF THE PREFERRED EMBODIMENTS

Figure 1:
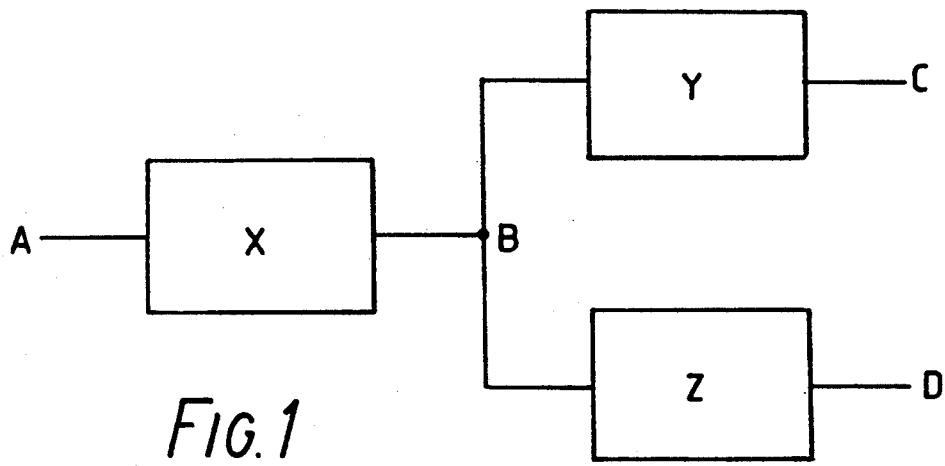
FIGS. 1 and 2 are simple block diagrams used in explaining the principles involved.

In general any circuit may be considered as sets of modules or components interconnected in a specific way. The relationships between the parameters, such as voltage and current, at the interconnections of the components are used to represent their behaviour, the interconnections being referred to as nodes. The descriptions used are both quantitative and qualitative so it is possible to detect small deviations from the correct behaviour of a circuit. The representation used does not require exact measurements or models but allows the use of qualitative descriptions given in a numerical way. For example, in its "active" state, the base of an npn transistor is between 0.5 and 0.8 Volts positive with respect to the emitter.

Certain components may have more than one mode of operation. Each mode has rules associated with it, stating how the component must behave in that mode. For example, transistors may be in Active, Saturated, Off or Reverse modes. Two alternative approaches may be adopted in these circumstances. The first is to use a complex enough description of the component to encompass its behaviour in all modes. The second is to consider the different modes individually. To obtain a consistent solution with a component operating in a particular mode all rules of behaviour for that mode must be satisfied. Combinations of these modes for the multi-mode components are tried using a backtracking algorithm until a consistent solution to the complete circuit model is found.

The problem with the second alternative is that it can lead to impossibly large combinations of models to be tried, requiring unacceptably long computing time. For this reason the first alternative is generally preferred although use may be made of the second alternative.

When checking whether an analogue circuit function is consistent with its measured behaviour it must be remembered that component values may not be exactly their specified value but could be at the limits of their specific tolerance. Measurements may only be correct within a specified range of accuracy. Thus, calculated nodal voltages and currents should not be a single value but a range of values with the size of that range dependent upon component tolerances and measurement accuracy.

In order to accommodate the uncertainty, the values of parameters such as voltage and current around a circuit are represented as ranges within which the true value must lie. For example each node has a maximum and a minimum possible voltage, and each branch of each node a maximum and minimum possible current. These ranges are initially set to extreme values such as voltage rails. As the constraints of the component models are applied, these ranges are progressively reduced until further application of the constraints has no more effect.

EXAMPLES OF SIMPLE DC COMPONENT MODELS

A Circuit Node. The currents at a node must be capable of summing to zero. The maximum current at any branch can therefore not be more than the negation of the sum of the minimum currents at all other branches at that node. Likewise, the minimum current for that branch cannot be less than the negation of the sum of the maximum currents at all other branches.

A Typical Bipolar NPN Transistor. This currently has four modes of allowed behaviour. The typical threshold voltage is taken to be 0.5 volts, by way of example. In all modes the sum of the current at all electrodes must be zero. Allowed current directions are specified such that current flows into the base junction.

1) The "OFF" mode. For an npn transistor to be in the off mode the current at each electrode must be zero and the base-emitter voltage difference must be less than 0.5 volts. The base-collector voltage difference must also be less than 0.5 volts.

2) The "ACTIVE" mode. For an npn transistor to be in the active mode the voltage difference from base to emitter must be in the range 0.5 to 0.8 volts and the maximum value of base current cannot exceed the maximum value of collector current divided by the minimum value of transistor current gain. The collector-emitter voltage difference must be at least 0.5 volts.

3) The "SATURATED" mode. For an npn transistor to be in the saturated mode the voltage difference from the base to emitter must lie in the range 0.5 to 1.1 volts. The voltage difference from the collector to emitter must lie in the range 0 V to 0.5 V. The base current is not negligible.

4) The "REVERSE" mode. For an npn transistor to be in the reverse mode the roles of the emitter and the collector are exchanged. In this situation, the emitter and collector currents are in an opposite direction to that of the "active" or "saturated" conditions.

A Resistor. A resistor has only one mode of allowed behaviour. The sum of the currents at the two connections must be zero. The tolerance of the resistor is used to form a range of allowed resistance values. New maximum and minimum values of current at each connection are calculated by applying Ohm's law to the maximum and minimum values of node voltage at each end and the range of resistance values. New maximum and minimum values of voltage at each end can be calculated by applying Ohm's law to the range of values of the resistance, the current and the voltage at the other end.

A Black Box. A black-box model is used to replace the models of suspect components in the diagnosis algorithm, as is explained below. It has only one mode of allowed behaviour. It imposes no constraints on the allowed magnitude or directions of the current at each pin, or any relationship between pin voltages and currents. The only constraint imposed by a black-box model is that all currents into the black-box must sum to zero (the power connections of components such as operational amplifiers have to be taken into account).

Under test, the circuit is stimulated and the results are measured. If, for all the applied tests, the measurements are consistent with the stimuli, the functions of the modules and the interconnectivity, no fault has been found. Otherwise it may be deduced that a fault exists, and the remaining task is to locate the fault.

Both the fault detection and location are performed hierarchically. The circuit is partitioned into blocks and an initial set of measurements taken. The response of the circuit under test is compared with the expected response, and if they are different the circuit can be assumed to be faulty. The objective is to discover any block whose function is inconsistent with the observed measurements. In the simple case, where the inputs and outputs to a block have been directly measured and are inconsistent with the function, it is immediately apparent that the block is faulty. Otherwise an attempt is made to isolate faulty blocks using constraint suspension techniques.

Consider the circuit of FIG. 1, in which the blocks X, Y, and Z represent amplifiers with gains of 1, 2, and 3 respectively. If the external connections A, C and D have signal amplitudes of 3, 0 and 9 volts respectively it is apparent that there is a fault. If the node B can be measured and yields a value of 3 volts, it is directly apparent that Block Y is faulty while X and Z are correct. This could also be deduced as will be explained later.

Using the circuit of FIG. 1 simplistically, the way in which the algorithm works is as follows. Initially, the nodes A, B, C, and D are given voltage ranges that correspond with the voltage rails. The ranges are then reduced to correspond with the measurements, allowing for the measurement accuracy. So, for example, the amplitude at Node A would be known to lie between 2.95 and 3.05 Volts. The constraints are then applied to each of the ranges in order to propagate them through the model. Given the constraint that Block X has a gain of between 0.95 and 1.05, its output can be expected to lie between 2.8 and 3.2 volts, so the measured value at B of between 2.95 and 3.05 is taken to be correct. In the case of Block Y however its measured output of between −0.05 and 0.05 would imply an input of between −0.1 and 0.1. Clearly there is an inconsistency and both the complete circuit and in this case block Y can be declared faulty.

In this simple case, we have considered only voltages at the nodes. It is possible for voltage measurements to be consistent but currents (which are not easily measured) to be inconsistent.

Figure 2:
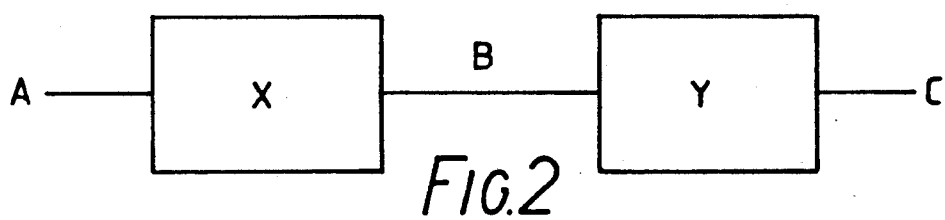

Consider the circuit of FIG. 2 in which voltages A and C are inconsistent, and in which the output of Block Y is dependent on the current into its low impedance input. Because of the low impedance a change in input current will only have a small effect on the voltage at B. This will appear to be consitent, within the measurement accuracies, with both A and C independently. Both blocks are suspect.

To confirm the correct operation of block Y, there must be a range of current at the output of block X, which is consistent with one of the set at the input to block Y, and the input and function of block X. If there are no such consistent current ranges for blocks X and Y, it is not possible to tell which currents are wrong and therefore not possible to tell in which block there is a fault without further probing.

Blocks which have not been confirmed as consistent are expanded to the next lower level of hierarchy and the diagnosis process is repeated until the whole can be made consistent by the suspension of constraints in this or other blocks.

This consistency checking method does not behave as a conventional analogue simulator, and as stated earlier, it does not attempt to converge the nodal voltages and currents to a single value, but instead to a small range of values which are consistent with the constraints imposed by the circuit structure and function. Consequently it does not suffer from convergence problems like conventional simulators. Another advantage of the method is that it allows the input values of a circuit which are consistent with a measured output to be calculated. The measurement accuracy and component tolerances are taken into account when calculating these ranges of values. Values calculated for any node represent the range within which it is expected to lie. Also it is possible to use extra measurements to confirm or further constrain the ranges calculated, and to perform the constraint suspension process.

A more detailed description of the method follows. Each node has a range of voltages associated with it. These are initialised to the extremes of possible values (e.g. the limits of the power rails). Each branch of each node has a range of currents associated with it which are also initialised to extreme values. Once the initial values have been set, constraint routines for the components and nodes are applied. The constraint routines for the components relate the voltages and currents for that component. The constraint routines for a node apply Kirchhoff's current law, and then exclude voltage ranges for the node which cannot lead to a consistent solution.

The consequence of the application of a constraint is to supply new values for some ranges. Provided that the circuit is consistent with its constraints, there will be an overlap of the old range with that calculated from the constraints. The new values for ranges are given by the overlaps.

Whenever a new measurement value is used, or a deduction is made which reduces the range of any current or voltage value, the results of that change are propagated to adjoining nodes and components. The behaviour of those adjoining nodes or components are then examined to check whether the new information will lead to an inconsistent solution, or whether any further deductions about value ranges can be made. This process is continued until no further change to the ranges occurs.

The circuit is said to be consistent if a range of voltage values for each node, and a range of currents for each branch of each node, can be implied from the measurements which do not break any of the constraints imposed by the circuits connectivity and the components models.

In the case of a faulty component, its behavior is no longer correct, so the values at the connections do not match the constraints imposed by its function. The complete circuit's operation in a faulty state could be simulated if the correct function of the assumed faulty component could be replaced by a model of the faulty function. This could then be compared with the measurements to confirm the assumption of the faulty component. In analogue circuits this is impractical due to the very large number of possible faults.

In the technique described herein, the constraints imposed by the functions of the components are removed successively, and the resulting circuit models are checked for consistency. (In fact its removal is effected by replacing its function by a "Black Box" model which is unconstrained). A component or set of components could be the cause of the fault if the removal of its constraints restores the consistency.

Using these techniques, therefore, one can locate faults in circuits with no fault simulation. It is therefore particularly suitable for analogue circuits.

Consider again the circuit of FIG. 1 in conjuction with Table 1 below and with no measurement of node B. In the case where the block Y is not working, the measurements were found to be inconsistent with the constraints imposed by the functions. If the contraints of block Y were removed (or replaced by the unconstrained black box model), the measurements would again become consistent with the constraints. If either of the other blocks had their constraints suspended instead, consistency would not be restored. It can therefore be deduced in this simple case that block Y is faulty.

(Note that consistency could also be restored by removing the constraints of both X and Z. However, parsimony leads one to believe that a single fault explaining the symptoms is the more likely).

TABLE 1

| | Module Constraints Removed | | | | | | | |
|---|---|---|---|---|---|---|---|---|
| | — | X | Y | Z | XY | YZ | XZ | XYZ |
| Value Inferred at B from A | 3 | — | 3 | 3 | — | 3 | — | — |
| Value Inferred at B from C | 0 | 0 | — | 0 | — | — | 0 | — |
| Value Inferred at B from D | 3 | 3 | 3 | — | 3 | — | — | — |
| Consistent Most likely explanation | No | No | Yes | No | Yes | Yes | Yes | Yes |

To accommodate the effects of component tolerances and measurement accuracies, this method is used except that instead of absolute values, each value is represented by a range. The effect of applying the constraints is progressively to narrow the range within which the value can lie. Inconsistency is detected, not by the absolute values being different, but by the ranges deduced from different constraints not overlapping.

When a fault occurs in one part of a circuit, the values will be wrong in other parts which are fed from the faulty part. In the case of circuits containing feedback loops this can have the effect of values being wrong all round the loop, including the input of the faulty component. It is therefore not sufficient to search back through the circuit until correct values are found. This will only lead to the input of the faulty feedback loop. However, because the method uses models of correctly functioning components, and assumes the components are behaving appropriately for the inputs they are receiving, it is able to deduce the values within the circuit, even though those inputs may be wrong. From this, provided that there are sufficient monitored points within the loop, it is possible to deduce which component is faulty.

The technique is not confined to finding single faults. If removing the constraints imposed by a single component's function does not produce a consistent solution, then we cannot say that that component is not faulty, but only that it is not the only fault within the block. If the algorithm is allowed to remove more than one component at a time, hypotheses of multiple faults can be created. The grouping of components into blocks which can either be eliminated from suspicion or treated as an entity, minimises the word of the constraint suspension algorithm in both the single and multiple fault situations.

Further measurements can be used to remove any ambiguity. Either probing at additional accessible points within the circuit, or using more input test stimuli often results in a smaller number of components which are capable of producing the observed inconsistencies.

To summarise, at each level of hierarchy, the first process is to check for consistency of the blocks and measurements. If these are inconsistent, constraint suspension is used to postulate possible faulty blocks. If the fault cannot be isolated to a block, further measurements between the blocks are used to assist isolation. If the fault has been isolated to one block the same process is repeated within the block. If there is more than one possibility, constraint suspension is performed on the sub-parts of each of the possible blocks in turn with the constraints imposed by the other whole blocks.

EXAMPLES

The method has been used on several simulated circuits, both with and without faults. The following examples serve to demonstrate its operation.

Figure 3:
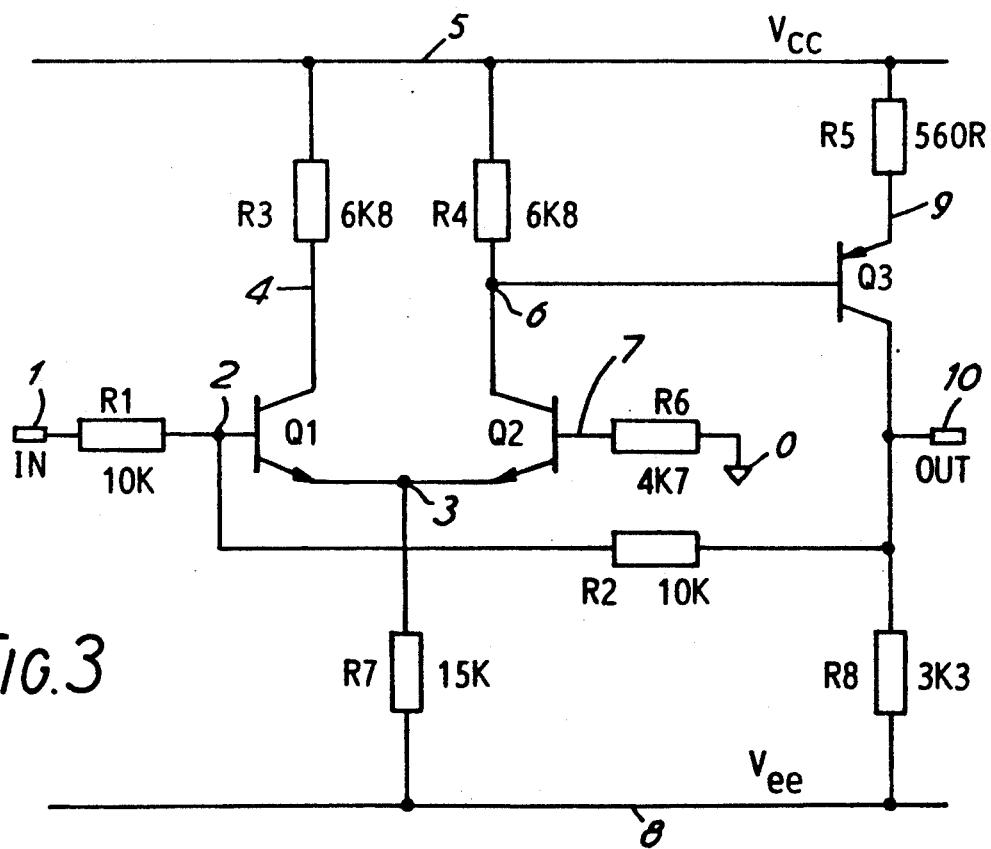
FIG. 3 is a circuit diagram of a practical circuit to be tested.

Table 2 shows how the successive application of constraints is used to reduce the ranges of voltage and current in the detection of faults in the circuit of FIG. 3. For simplicity only the part of the circuit around Q1 is considered. Initially, the voltage range of all the nodes are set to the maximum possible extremes ±15.05 Volts which is the supply rails allowing for tolerance, and the currents to ±300 Amps. The measured values at input, output and supplies are then used to limit the ranges of those nodes, again allowing for tolerances. In Table 2, the changes in Stage 0 refer to those that can be inferred from the measurements and the general constraints for the components. The changes in Stage 1 to those using the active mode rules for Q1. The algorithm continues to choose modes and apply the constraints until consistency is proved or found to be unachievable with the circuit using that set of component models.

Table 2 shows the voltage ranges for all the nodes at the end of each stage.

TABLE 2

| Component/ Connection | Voltage/Current Min | Max | | Justification |
|---|---|---|---|---|
| STAGE 0 | | | | |
| Vcc | 14.95 | 15.05 | V | Measurement |
| Vee | −15.05 | −14.95 | V | Measurement |
| In | −0.05 | 0.05 | V | Measurement |
| Out | −0.02 | 0.08 | V | Measurement |
| R1 | −1.51 | 1.51 | mA | Input, ±15.05 at Q1 base, 10KΩ and Ohm's Law |
| R2 | −1.51 | 1.51 | mA | Output, ±15.05 at Q1 base, 10KΩ and Ohm's Law |
| Q1 base | 0.00 | 3.02 | mA | I in R1 & R2 |
| R3 | −4.42 | 0.00 | mA | 15 ± 0.05 at Vcc, ±15.05 at Q1 collector, 6.8KΩ & Ohm's Law |
| Q1 collector | 0.00 | 4.42 | mA | I in R3 |
| Q1 emitter | −7.44 | 0.00 | mA | $I_b$ & $I_c$ |
| R7 | 0.00 | 2.00 | mA | 15 ± 0.05 at Vee, ±15.05 at Q1 emitter, 15KΩ and Ohm's Law |
| Q1 emitter | −2.00 | 0.00 | mA | I in R7 |
| Q1 collector | 0.00 | 2.00 | mA | Cannot be greater than $I_e$ |
| Q1 base | 0.00 | 2.00 | mA | Cannot be greater than $I_e$ |
| R3 | −2.00 | 0.00 | mA | $I_c$ |
| Q1 collector | 1.20 | 15.05 | V | $I_c$ |
| Q1 base | −10.22 | 0.07 | V | The base current flowing from R1 & R2 and Ohm's Law |
| R1 | −1.03 | 0.01 | mA | Input, −10.22 to 0.07 at Q1 base, 10KΩ and Ohm's Law |
| R2 | −1.03 | 0.01 | mA | Output, −10.22 to 0.07 at Q1 base, 10KΩ and Ohm's Law |
| STAGE 1 | | | | |
| Q1 base | 0.00 | 0.05 | mA | Ic and $h_{fe}$ |
| Q1 emitter | −11.10 | −0.44 | V | The emitter must be between 0.5 and 0.8 Volts negative wrt base |
| R7 | 0.26 | 0.97 | mA | −15 ± 0.05 at Vee, −11.10 to −0.44 at Q1 emitter, & 15KΩ |
| R1 & R2 | −0.06 | 0.01 | mA | From the base current and the Input and Output voltages |
| AND SO ON ... | | | | |

Table 3 is less detailed than Table 2 but shows how the process is continued through more stages.

TABLE 3

| node numb | Simulation results | minimum deduced volts | maximum deduced volts |
|---|---|---|---|
| 0 | 0.00 | −0.05 | 0.05 |
| 1 | 0.00 | −0.05 | 0.05 |
| 2 (0) | −0.03 | −15.05 | 0.94 |
| 2 (1) | | −0.24 | 0.05 |
| 2 (2) | | −0.14 | 0.05 |
| 3 (0) | −0.78 | −15.05 | 15.05 |
| 3 (1) | | −1.04 | −0.45 |
| 3 (2) | | −0.93 | −0.45 |
| 3 (3) | −0.78 | −0.90 | −0.45 |
| 4 (0) | 12.30 | −15.05 | 15.05 |
| 4 (1) | | −0.54 | 15.05 |
| 4 (2) | | 8.33 | 15.05 |
| 4 (3) | | 11.26 | 12.85 |
| 5 | 15.00 | 14.95 | 15.05 |
| 6 (0) | 11.60 | −15.05 | 15.05 |
| 6 (2) | | 8.33 | 15.05 |
| 6 (3) | | 11.53 | 12.02 |
| 7 (0) | −0.04 | −15.05 | 0.05 |
| 7 (2) | | −0.13 | 0.05 |
| 7 (3) | | −0.10 | −0.05 |
| 8 | −15.00 | −15.05 | −14.95 |
| 9 (0) | 12.40 | −15.05 | 15.05 |
| 9 (3) | | 12.33 | 12.52 |
| 10 | 0.02 | −0.03 | 0.07 |

STAGE (0): At stage zero all voltage and current ranges were initialised and the effects of measurements made at the input and output (nodes 1 and 10) were deduced. The measurement accuracy was specified to be 50 mV. Thus initial values at node 5 (VCC) were set to be in the range 14.95 to 15.05 volts, at node 8 (VEE) to be in the range −15.05 to −14.95 volts, at node 0 (GND) to be in the range −0.05 to 0.05 volts, at node 1 (IN) to be in the range −0.05 to 0.05 volts and at node 10 (OUT) to be in the range −0.03 to 0.07 volts. Initial values of node voltage at all other nodes were set to be in the range −15.05 to 15.05 volts. Initial values of current at all component branches and at the external GND,VCC,VEE and IN were set arbitrarily to be in the range −300 to +300 Amps. The external current at node OUT was set to zero because no output current was taken.

From initial component constraints and measurements taken it was deduced that the node 2 voltage was in the range −15.05 to 0.94 volts. This occured because the iteration algorithm deduced that higher values of voltage were inconsistent with the allowed directions of the Q1 base current and the voltage at the other sides of the resistors R1 and R2. It was also deduced at this stage that the node 7 voltage was in the range −15.05 to 0.05. This could be deduced because the current in the R6 resistor had to be in the same direction as the current into an npn transistor base.

Each subsequent stage contains the deductions which became possible because of the selection of mode for one of the transistors.

STAGE (1): At stage 1, Q1 was selected to be in the active mode. The range of possible voltages at node 2 was reduced to −0.24 and 0.05 V. This occured because the current into the Q1 base when Q1 is in active mode was limited to the maximum value of collector current divided by the minimun gain of a good npn transistor. The node 3 voltage was deduced to be in the range −1.04 to −0.45 volts because of the new reduced range at node 2 and the limits the base-emitter voltage of Q1 could take in the active mode. The node 4 voltage was deduced to be in the range −0.54 to 15.05 volts because the collector voltage of an npn transistor is at least 0.5 V more positive than the emitter voltage in the active mode.

STAGE (2): After selecting transistor Q2 to be in the active mode, the range of voltage values at node 4 and at node 6 was reduced to 8.33 and 15.05 volts because the R4 and the R3 currents were both deduced to be less than the R7 current. This limited the voltage drop possible across them. The range of values at node 7 was reduced to −0.13 to 0.05 volts because the current in the Q2 base was limited to be a fraction of the maximum collector current.

STAGE (3): After selecting transistor Q3 to be in the active mode, its base current could be calculated from the collector current. Consequently the range of values at node 9 was reduced to 12.33 to 12.52 volts because the current in R5 was deduced to be equal to the sum of the currents in R8, R2 and the base. This in turn constrained the range of voltages at node 6 to be 11.53 to 12.02 V because the voltage at node 6 was one base-emitter voltage drop below that at node 9. The R4 current therefore got a new minimum value which reduced the maximum possible value of the R3 current. Hence the node 4 voltage became constrained to be between 11.26 to 13.0 volts.

No further deductions were possible, and a consistent solution was obtained.

A fault was introduced in the above circuit. This fault was an open circuit on transistor Q3's base-collector junction. The results of simulating this faulty circuit and using the constraint checker are shown in Table 4.

TABLE 4

| node numb | Simulation result | minimum deduced volts | maximum deduced volts |
|---|---|---|---|
| 0 | 0.00 | −0.05 | 0.05 |
| 1 | 0.00 | −0.05 | 0.05 |
| 2 | −6.44 | −6.50 | −6.40 |
| 3 (0) | −0.81 | −15.05 | 15.05 |
| 3 (1) | | −7.00 | −0.35 |
| 3 (2) | | −0.93 | −0.45 |
| 4 (0) | 15.00 | −15.05 | 15.05 |
| 4 (2) | | 14.95 | 15.05 |
| 5 | 15.00 | 14.95 | 15.05 |
| 6 | 13.75 | 13.70 | 13.80 |
| 7 (0) | −0.04 | −15.05 | 0.05 |
| 7 (2) | | −0.13 | 0.05 |
| 8 | −15.00 | −15.05 | −14.95 |
| 9 (0) | 14.60 | −15.05 | 15.05 |
| 9 (2) | | 14.47 | 14.67 |
| 10 | −12.4 | −12.92 | −12.82 |

Measurements were taken at node 6 as well as the input/output pins and power rails. The measurements taken were found to be inconsistent with the circuit function. The consistency check was performed with constraint suspension on each component in turn. A consistent solution was obtained when the constraints of components Q1, R2 or Q3 were suspended. The input stimulus was changed to +5 volts, and a consistent solution was obtained only when components Q1, Q2 or Q3 were suspended. The common suspects are Q1 and Q3 only. The list of suspects was reduced to Q3 alone when an extra measurement at node 2 was added.

The ranges deduced at each node of the faulty circuit with Q3 suspended and measurements taken at nodes 1,2,6 and 10 are also shown in Table 2. The only consistent solution was obtained when Q1 was deduced to be off (this occurred at stage 1) and Q2 was deduced to be active (this occurred at stage 2). It can be seen that the voltages deduces at all nodes were consistent with the values actually obtained. With the function of Q3 suspended the values of current deduced at the connections were consistent with the fault inside Q3. The Q3 collector current range was deduced to be −0.04 to +0.04 mA. This is consistent with the actual value of zero. The Q3 base and emitter current were deduced to be in the range 0.67 to 0.80 mA in the correct direction which is consistent with the actual value of 0.75 mA.

So far for simplicity, the description has been confined to explanations of d.c. operation. However, using models of the a.c. function of the components, the algorithm works just as well finding a.c. faults.

The technique has been used in tests to diagnose faults in a discrete amplifier circuit (FIG. 3), and a hierarchical circuit as FIG. 1, where each of the blocks expands to an instance of the discrete amplifier circuit. In each case the number of measurements within the circuit were kept to a minimum. The method was able to diagnose faults to an individual component with only two nodes internal to the circuit being measured (See Table 5).

TABLE 5

| Fault | Measured Internal Nodes | Suspect Components |
|---|---|---|
| Q1 Open Circuit base-collector | 4 | Q1 |
| Q3 Open Circuit base-collector | 6 | Q1, Q3 & R2 |
| | 6 & 2 | Q3 |
| Q3 Short Circuit collector-emitter | 6 | Q3 & R8 |
| | 6 & 9 | Q3 |
| Q3 Open Circuit | 6 | Q3, R5 & R8 |
| | 6 & 9 | Q3 |

Subsequently the method was used with a high speed discrete buffer amplifier circuit with complex protection. Operational amplifier, JFET and bipolar transistor models were required as well as models for diodes, resistors, capacitors etc. There were a total of over 80 components in the circuit, so it was divided into six functional blocks and considered hierarchically. A variety of faults were introduced, ranging from component value changes to component failures. The circuit was tested at both d.c. and also at a.c. for frequency response. Measurements were restricted to the input and output and the interfaces between the blocks (a total of 14). All the faults that could be detected with the stimuli applied were diagnosed to 4 suspects or less. In all cases the faulty component was one of the suspects. Some of the results are shown in table 6 below. The time shown is the time the algorithm took to complete the diagnosis on a SUN 3/50 workstation.

TABLE 6

| Fault | Suspects | Time |
|---|---|---|
| Transistor (Q20) open circuit base-collector | 4 Transistor (Q20), 2 Resistors or 1 zener diode | 5:15 |
| Transistor (Q24) open circuit base-collector | 3 Transistor (Q24), or 1 zener diode | 7:00 |
| Resistor (R55) value error | 3 Resistor (R55), 1 transistor or 1 diode | 7:30 |
| Diode (D56) reversed | 3 Diode (D56), 1 resistor or 1 transistor | 8:00 |
| Resistor (R29) short circuit | 1 Resistor (R29) | 2:15 |
| Capacitor (C8) value error | 2 Capacitor (C8) or 1 resistor | 6:30 |
| Transistor (Q74) changed a.c. characteristics | 3 2 transistors (including Q74), or 1 resistor | 77:15 |

Figure 4:
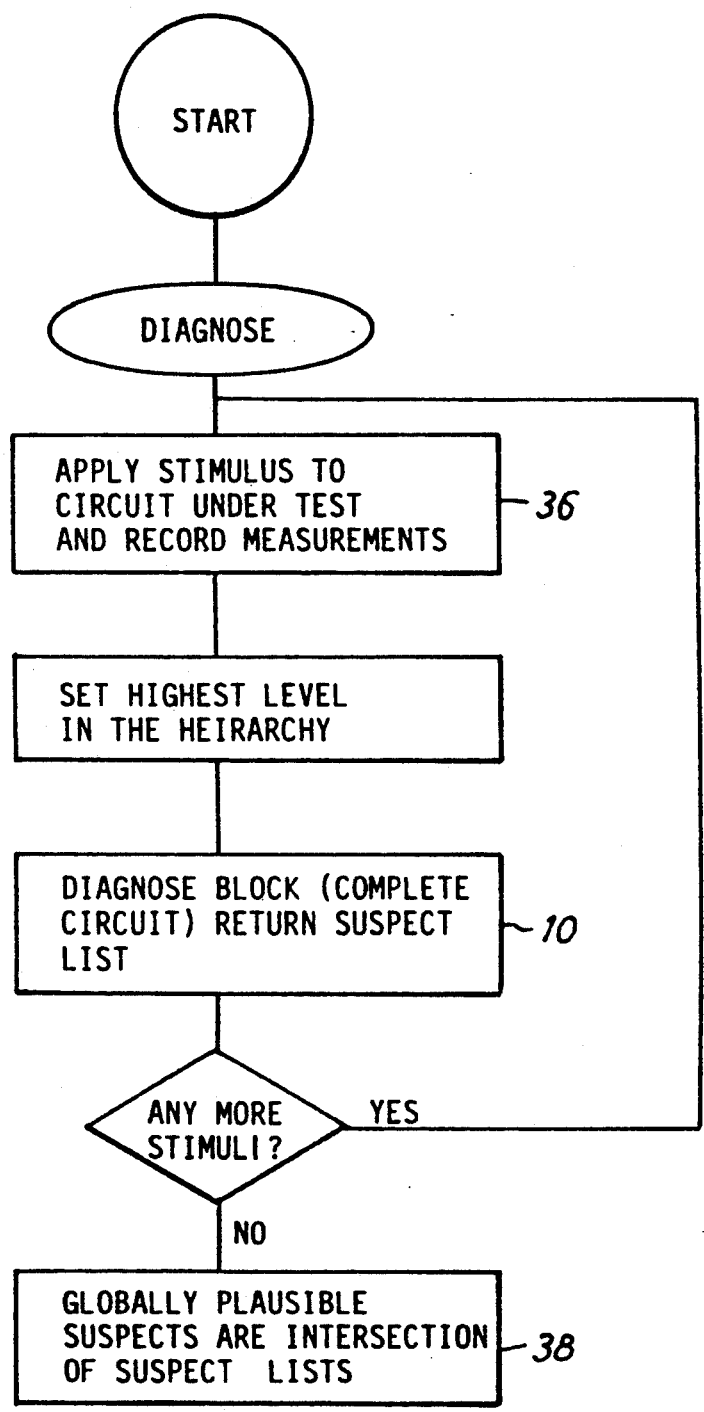
FIGS. 4 to 14 are flow charts for automated implementation of the method.
Figure 5:
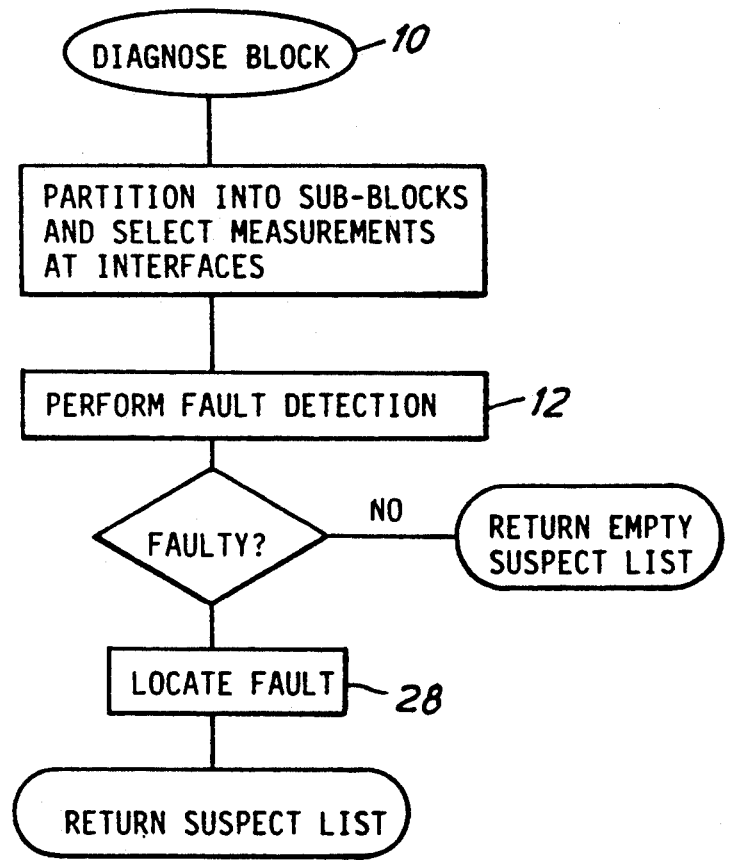

The flow charts given in FIGS. 4 to 14 will be self-explanatory in the light of the foregoing description. Briefly FIG. 4 shows the overall algorithm in which the crucial operation is the Diagnose Block 10. This is illustrated in more detail in FIG. 5 comprising block 12

Figure 6:
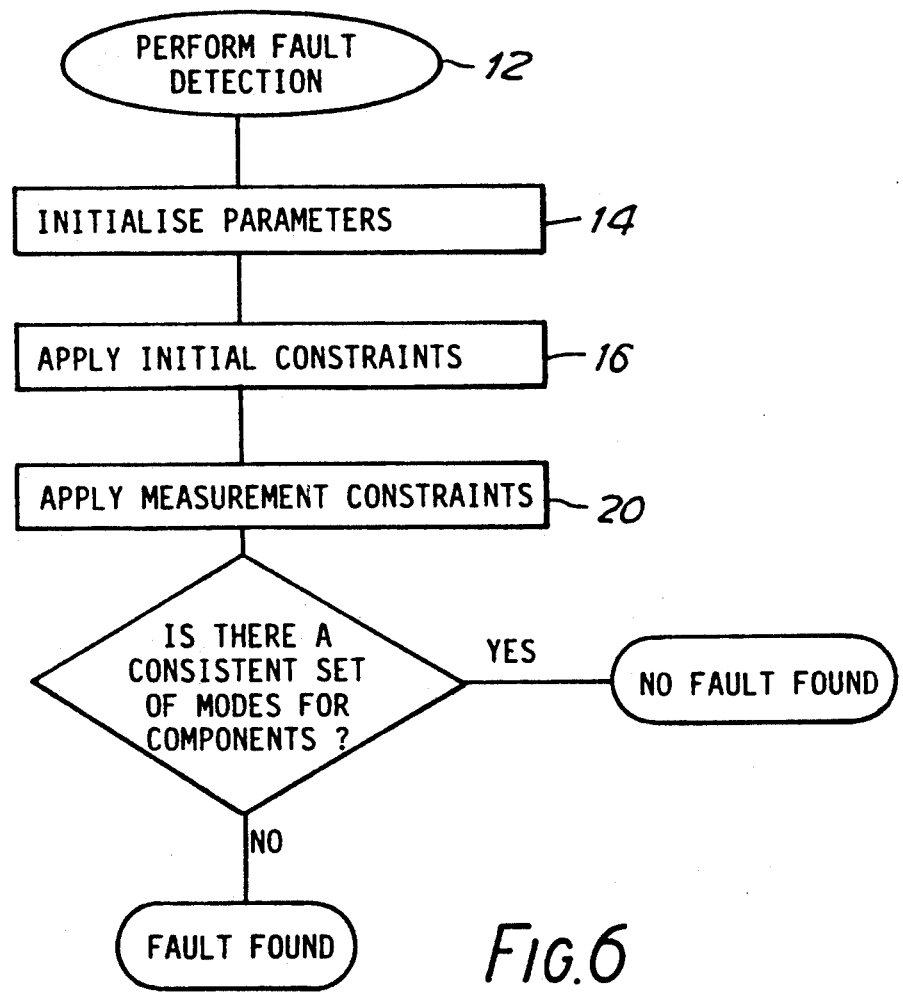
Figure 7:
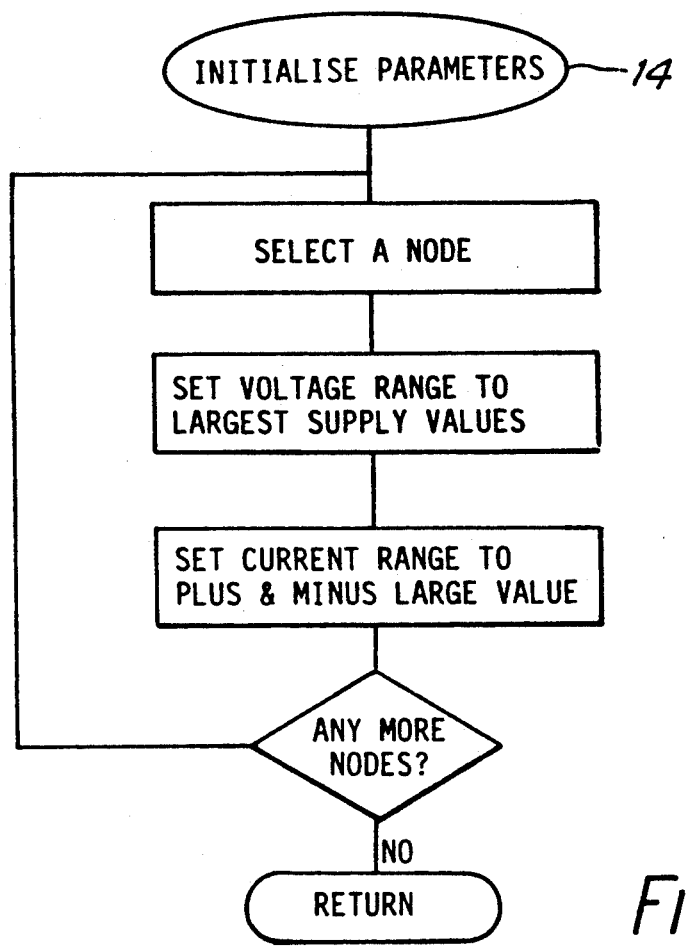
Figure 8:
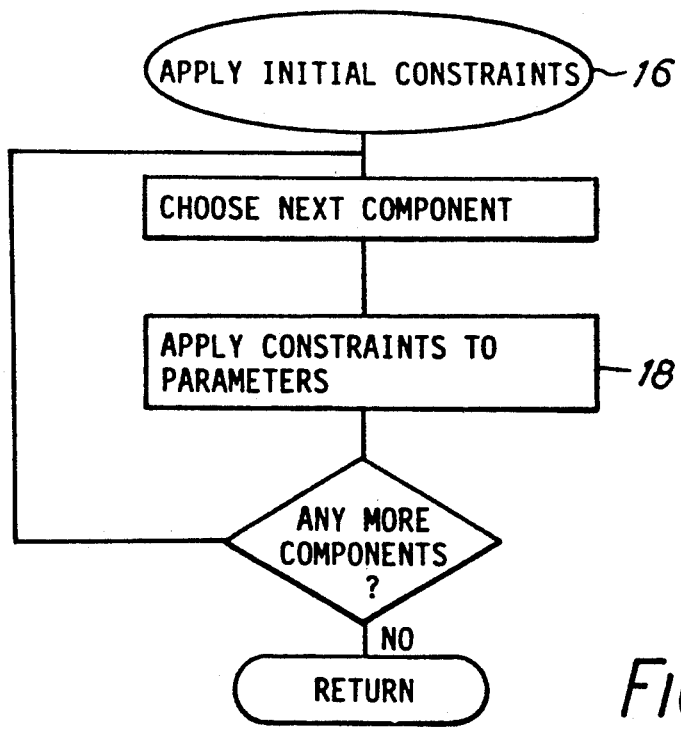
Figure 9:
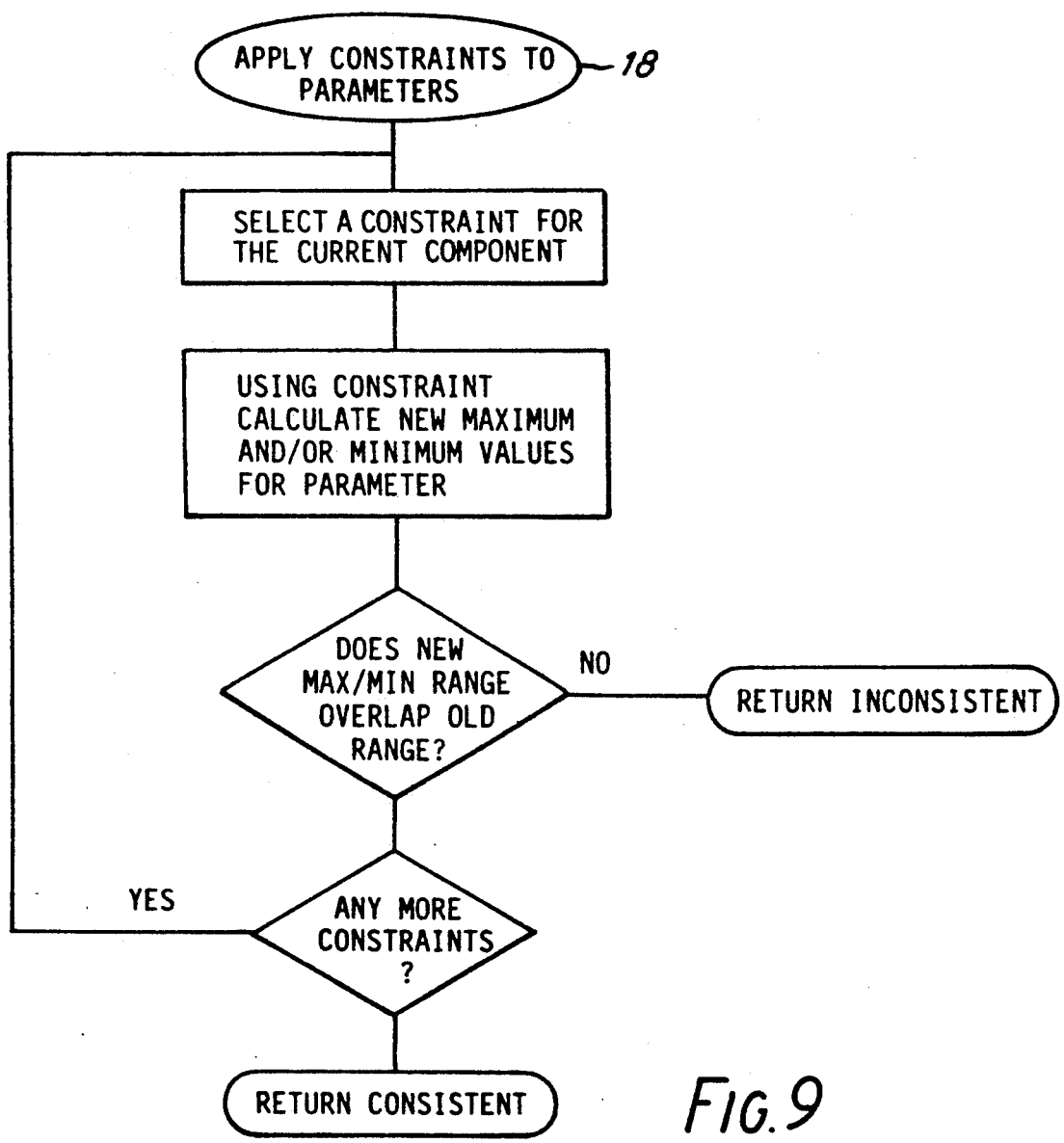
Figure 10:
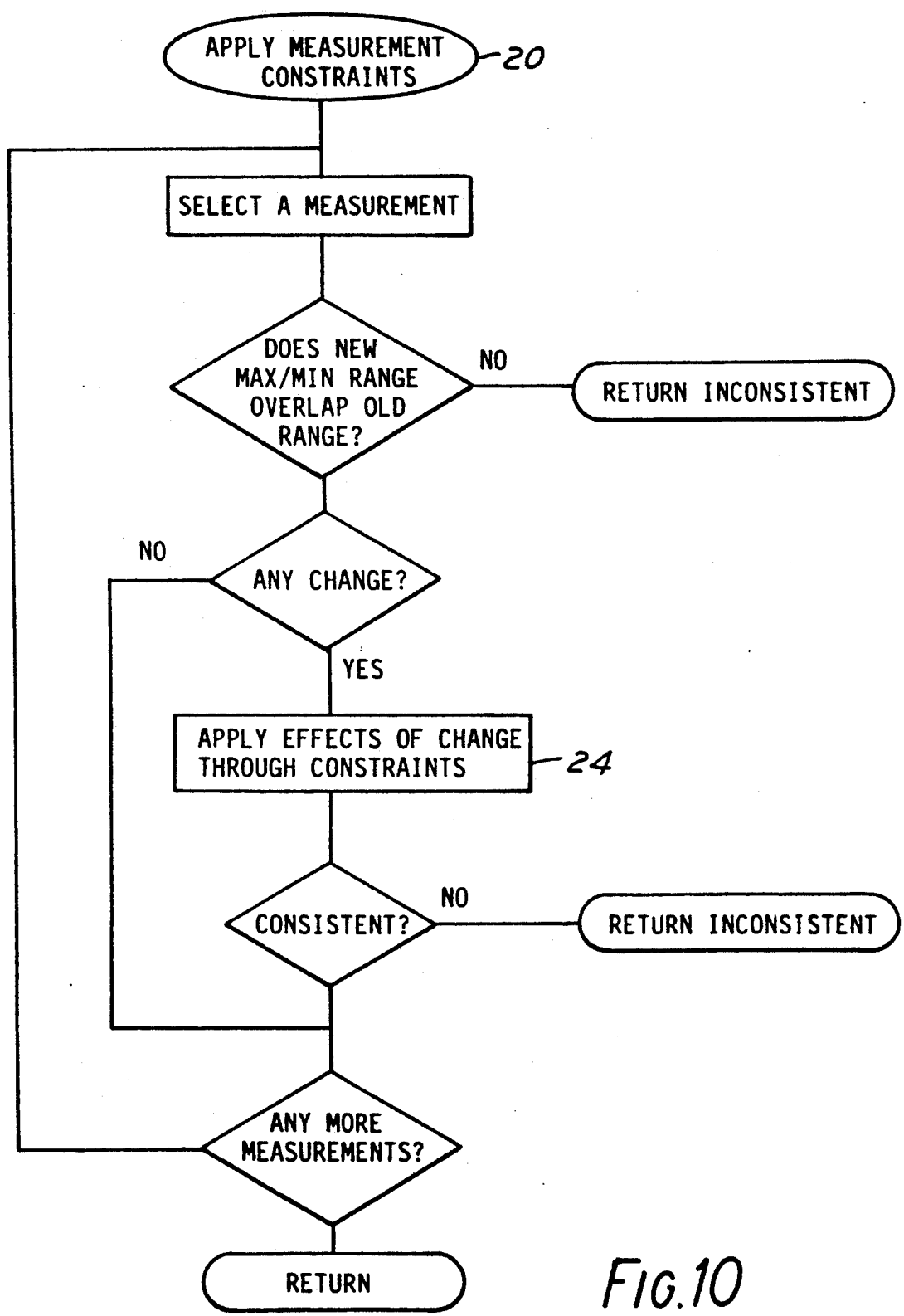
Figure 11:
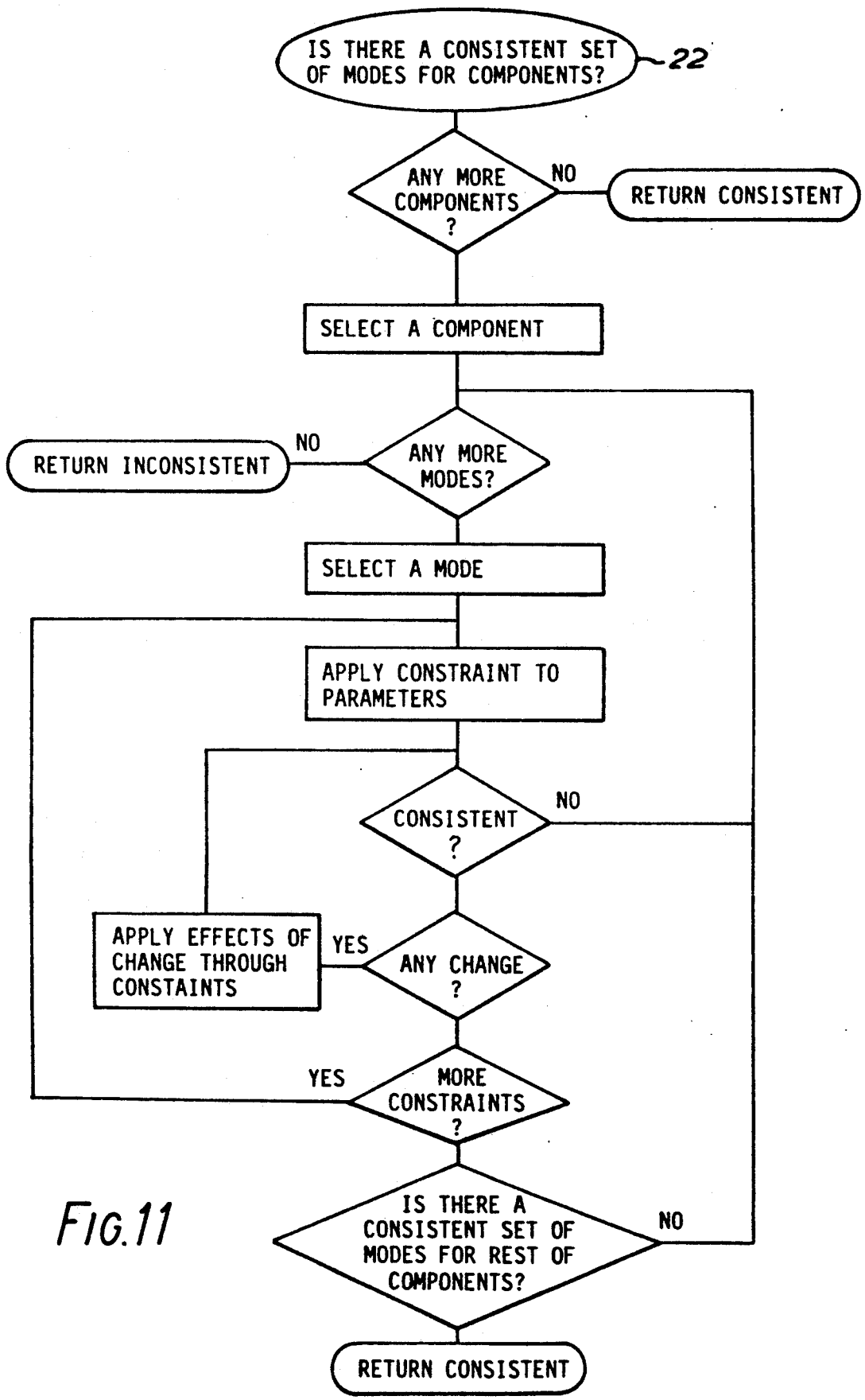

Perform Fault Detection which is in turn expanded in FIG. 6. In FIG. 6 the first operation is Initialise Parameters, block 14 shown in FIG. 7. Then follows Apply Initial Constraints, block 16 shown in FIG. 8 and in more detail (block 18) in FIG. 9. Then follows in FIG. 6 Apply Measurement Constraints, block 20 which is shown in FIG. 10. Finally FIG. 6 involves the consistency check of block 22 which is shown in detail in FIG. 11.

Figure 12:
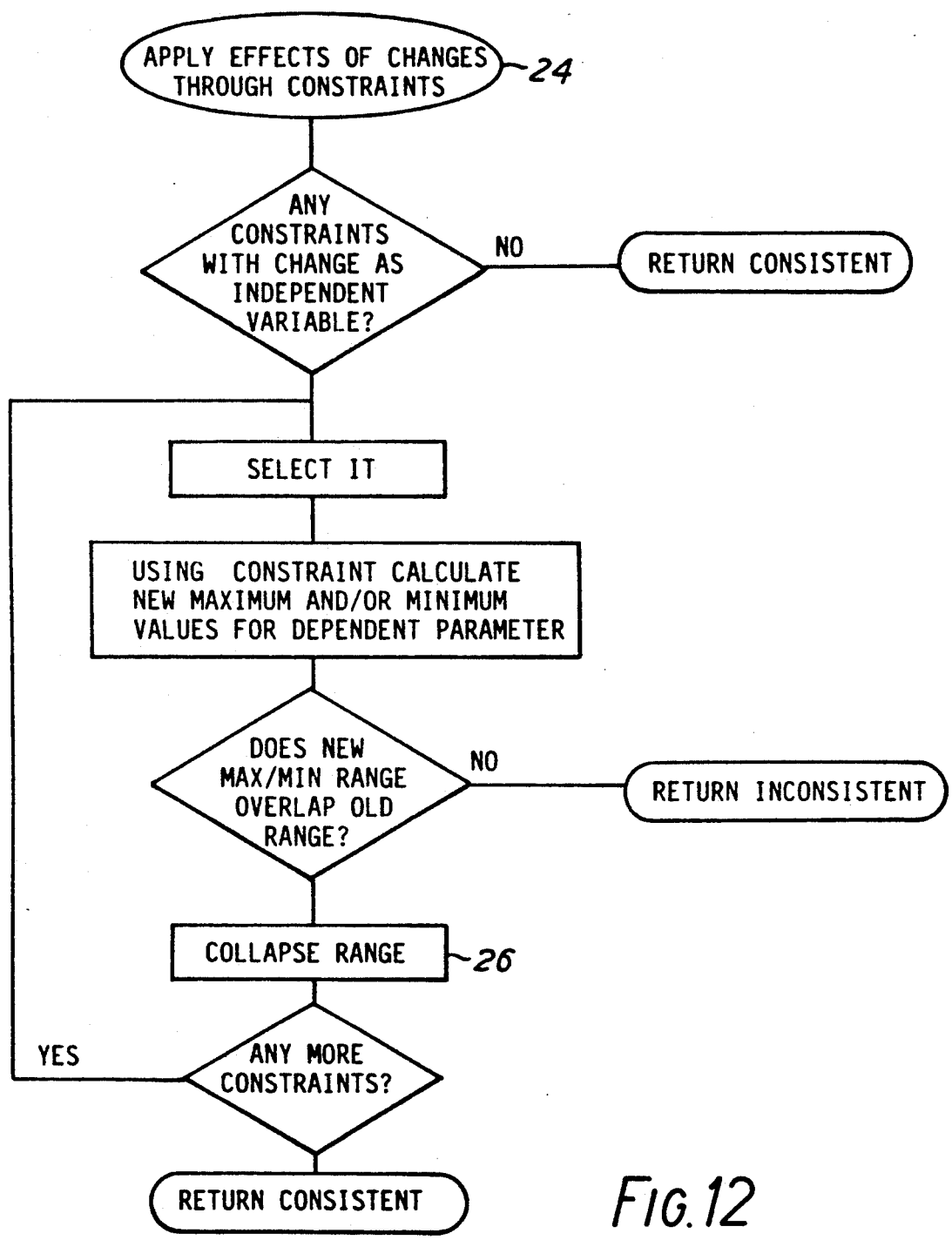
Figure 13:
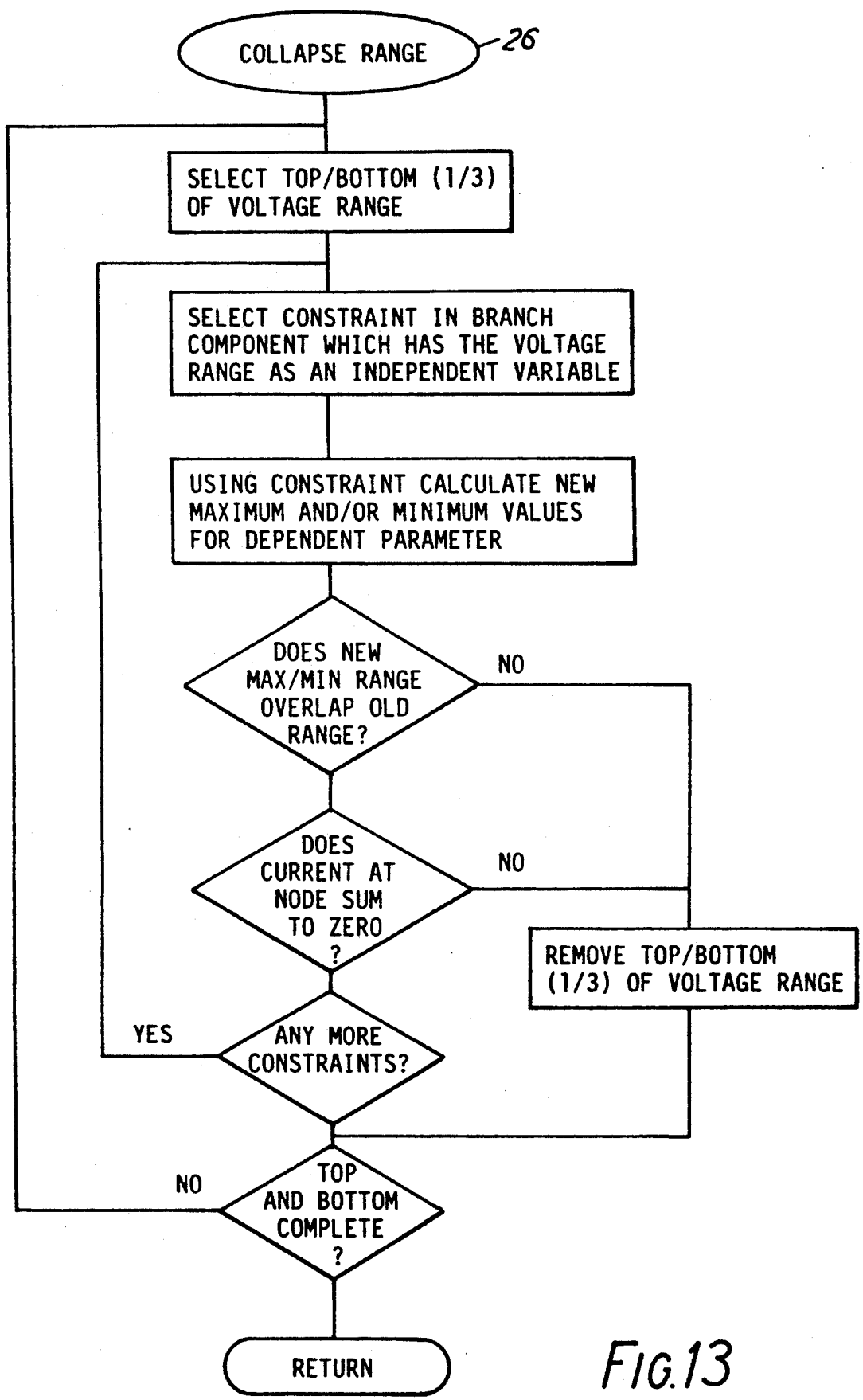
Figure 14:
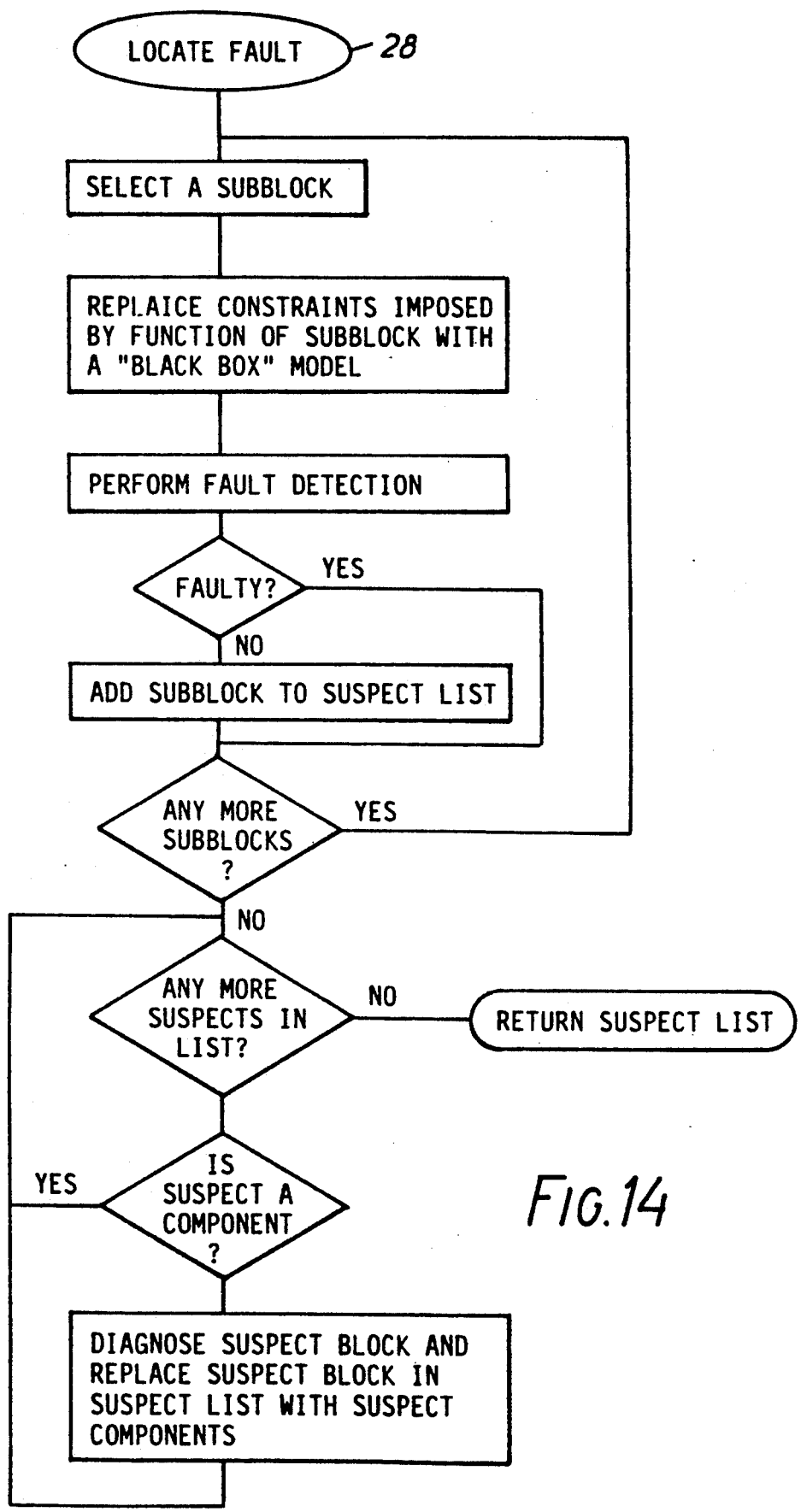

When the measurement constraints are applied (FIG. 10) it is necessary to apply the effects of any changes thereby imposed, as indicated in block 24 which is shown in FIG. 12. This in turn may involve collapsing a constraint range (block 26) which is implemented as shown in FIG. 13. Finally after performing fault detection, block 12 in FIG. 5, any fault detected must be located, block 28. This is performed by moving further down the heirarchy, as shown in FIG. 14.

Figure 15:
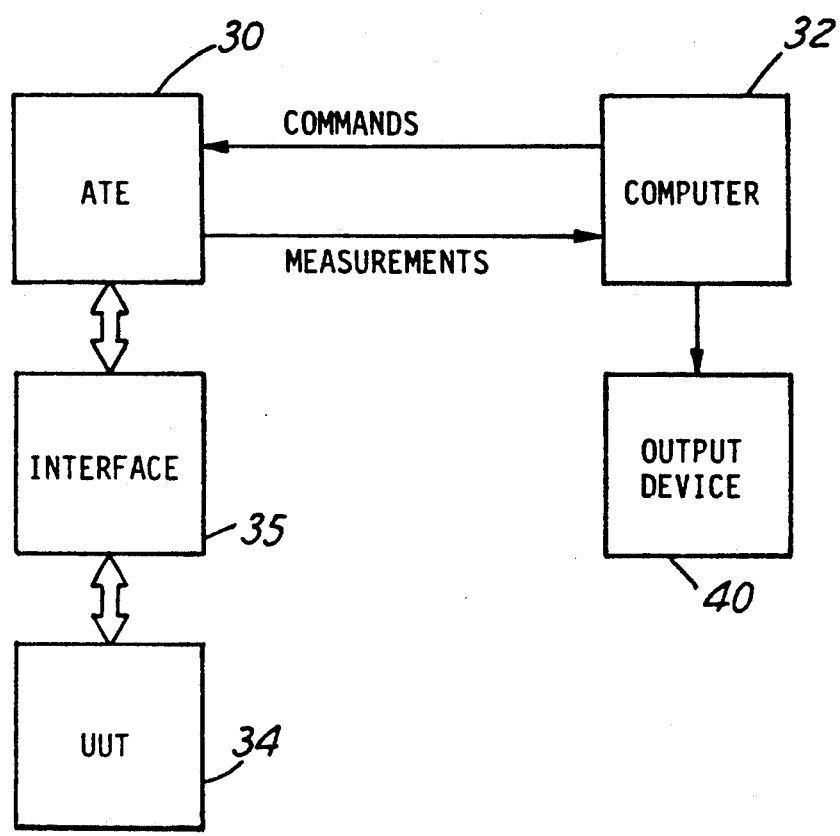
FIG. 15 is a block diagram of apparatus according to the invention.

The apparatus according to the invention can be based on a standard Automatic Test Equipment (ATE) 30 in conjunction with a computer 32 (FIG. 15) programmed in accordance with the algorithm of the flow charts and receiving measurement values from the UUT 34 via an interface 35. The computer 32 moreover sends commands to the ATE 30 to determine the stimuli applied to the UUT 34 (block 36 in FIG. 4) and the final output, block 38 in FIG. 4, is applied to an output device 40, e.g. a monitor and/or printer.

The algorithm of the flow charts may be implemented in the computer by a program in any suitable programming language.

We claim:

1. A method of testing an analogue circuit, the circuit comprising a network of electrical modules interconnected by nodes, each module comprising an electrical component or set of electrical components, the method comprising a measurement routine including the steps of
   (1) interfacing the circuit to automatic test apparatus, said test apparatus comprising means for interfacing with said circuit, means for applying stimuli to said circuit and means for taking test measurements from said circuit,
      (ii) selecting a set of stimuli, including supply potentials, for application to the circuit,
      (iii) applying said set of stimuli to first nodes of said circuit via said interfacing means,
      (iv) taking a set of test measurements from second nodes of the circuit via said interfacing means,
      (v) conducting at least one analysis cycle, employing the automatic test apparatus for each analysis cycle, each analysis cycle comprising the steps of
         (a) analyzing the circuit as a network of nodes connected by modules which impose constraints on signals passing between the nodes,
         (b) using the set of stimuli, the test measurements, and the constraints, taking into account tolerances in all of said stimuli, measurements, and constraints, to derive at least two differently derived ranges of values of a signal variable propagated within the network at at least one of a complete set of nodes,
         (c) detecting a fault if said differently derived ranges of the variable do not overlap so as to indicate an inconsistency, and
         (d) if a fault is detected, repeating the analysis cycle which has led to a fault being detected with the constraints on a selected module removed, other than the constraint that all the currents into the module sum to zero, and treating said selected module as potentially faulty if such removal of constraints leads to a removal of the inconsistency.

2. A method according to claim 1, wherein, said measurement routine or an analysis cycle is conducted repeatedly in respect of a plurality of nodes.

3. A method according to claim 2, wherein in repeated routines or cycles further constraints are introduced by requiring a node at which derived ranges overlap to have a value of the variable lying within a new range which is the intersection of the overlapping ranges.

4. A method according to claim 3, wherein said further constraints are propagated in ensuing routines or analysis cycles into the derivation of ranges at other nodes.

5. A method according to claim 3, wherein an analysis cycle which has led to an inconsistency is repeated with the constraints on a selected module removed, other than the constraint that all the currents into the module sum to zero, and said selected module is treated as potentially faulty if such removal of constraints leads to removal of the inconsistency.

6. A method according to claim 1, wherein, when a fault has been detected, measurement routines using different stimuli are carried out to obtain additional information indicative of fault location.

7. A method according to claim 6, wherein said measurement routines are carried out in a hierarchical manner.

8. A method according to claim 7, wherein measurement routines are effected in terms of progressively smaller modules.

9. A method according to claim 1, and further including, when a fault has been detected, the step of carrying out measurement routines using different measurements to obtain additional information indicative of fault location.

10. A method according to claim 9, wherein said measurement routines are carried out in a heirarchical manner.

11. A method according to claim 10, wherein analysis is effected in terms of progressively smaller modules.

12. A method according to claim 1, and further including, when a fault has been detected, the step of carrying out analysis cycles using different analyses to obtain additional information indicative of fault location.

13. A method according to claim 12, wherein said analysis cycles are carried out in a heirarchical manner.

14. A method according to claim 13, wherein analysis is effected in terms of successively smaller modules.

15. A method according to claim 1, wherein the test measurements are all voltage measurements.

16. A method according to claim 1, wherein the derived ranges of values include both voltage and current values.

17. Test apparatus for testing an analogue circuit, the circuit comprising a network of electrical modules interconnected by nodes, each module comprising an electrical component or set of electrical components, the apparatus comprising
   interface means for interfacing said circuit to the test apparatus, means for applying a set of stimuli, including supply potentials, to the circuit at first nodes thereof via said interface means, means for taking a set of test measurements from second nodes of the circuit via said interface means, and data processing means for analyzing the circuit as a network of nodes connected by said modules which impose constraints on signals passing between the nodes, and deriving from the set of stimuli, measurements, and constraints imposed by the modules, taking into account tolerances in all of these, at least two differently derived ranges of values of a variable at at least one of the complete set of nodes, the ranges of values of a signal variable being derived by propagation within the network, wherein the data processing means is further operative to determine whether differently derived ranges overlap or not, such that a fault is detected if said ranges do not overlap to indicate an inconsistency, and if a fault is detected, the data processing means is further operative to analyze the circuit with the constraints on a selected module removed, other than the constraint that all the currents into the module sum to zero, said data processing means being operative to treat said selected module as potentially faulty if such removal of constraints leads to removal of the inconsistency.

* * * * *